United States Patent
Ohshima et al.

(10) Patent No.: US 11,784,022 B2
(45) Date of Patent: Oct. 10, 2023

(54) ELECTRON BEAM APPARATUS

(71) Applicant: Hitachi High-Tech Corporation, Tokyo (JP)

(72) Inventors: Takashi Ohshima, Tokyo (JP); Tatsuro Ide, Tokyo (JP); Hideo Morishita, Tokyo (JP); Yoichi Ose, Tokyo (JP); Tsunenori Nomaguchi, Tokyo (JP); Toshihide Agemura, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 248 days.

(21) Appl. No.: 17/425,872

(22) PCT Filed: Jan. 28, 2019

(86) PCT No.: PCT/JP2019/002803
§ 371 (c)(1),
(2) Date: Jul. 26, 2021

(87) PCT Pub. No.: WO2020/157809
PCT Pub. Date: Aug. 6, 2020

(65) Prior Publication Data
US 2022/0165536 A1    May 26, 2022

(51) Int. Cl.
*H01J 37/073* (2006.01)
*G02B 3/04* (2006.01)
(Continued)

(52) U.S. Cl.
CPC ............. *H01J 37/073* (2013.01); *G02B 3/04* (2013.01); *H01J 37/1474* (2013.01);
(Continued)

(58) Field of Classification Search
CPC .. H01J 37/00; H01J 37/02; H01J 37/26; H01J 37/28; H01J 37/073; H01J 37/1474;
(Continued)

(56) References Cited

U.S. PATENT DOCUMENTS 5,684,360 A    11/1997   Baum et al.
5,898,269 A *  4/1999    Baum ..................... H01J 3/021
                                                            313/530

(Continued)

FOREIGN PATENT DOCUMENTS

JP    S6191844 A    5/1986
JP    H11509360 A   8/1999

(Continued)

OTHER PUBLICATIONS

Kuwahara et al. "Coherence of a spin-polarized electron beam emitted from a semiconductor photocathode in a transmission electron microscope" Applied Physics Letters, vol. 105, p. 193101, 2014.

(Continued)

*Primary Examiner* — Jason L McCormack
(74) *Attorney, Agent, or Firm* — MILES & STOCKBRIDGE, P.C.

(57) ABSTRACT

A scanning electron beam apparatus which two-dimensionally scans a sample by an electron beam to achieve high resolution even with a photoexcited electron source. The electron beam apparatus includes a photocathode including a substrate having a refractive index of more than 1.7 and a photoemissive film, a focusing lens configured to focus an excitation light toward the photocathode, an extractor electrode disposed facing the photocathode and configured to accelerate an electron beam generated from the photoemissive film by focusing the excitation light by the focusing lens and emitting the excitation light through the substrate, and an electron optics including a deflector configured to two-dimensionally scan a sample by the electron beam accelerated by the extractor electrode. For a spherical aberration of the focusing lens, a root mean square of the spherical (Continued)

aberration on the photoemissive film is equal to or less than $1/14$ of a wavelength of the excitation light.

8 Claims, 6 Drawing Sheets

(51) Int. Cl.
  *H01J 37/147* (2006.01)
  *H01J 37/22* (2006.01)
  *H01J 37/28* (2006.01)

(52) U.S. Cl.
  CPC .............. *H01J 37/22* (2013.01); *H01J 37/28* (2013.01); *H01J 2237/0473* (2013.01)

(58) Field of Classification Search
  CPC .............. H01J 37/22; H01J 2237/0473; H01J 2237/06333; H01J 1/34; G02B 3/04
  USPC .............................. 250/306, 307, 311, 396 R
  See application file for complete search history.

(56) References Cited

U.S. PATENT DOCUMENTS

| | | |
|---|---|---|
| 6,005,247 A | 12/1999 | Baum |
| 6,828,574 B1 | 12/2004 | Allen |
| 2002/0079448 A1 | 6/2002 | Ishitani et al. |
| 2003/0048427 A1* | 3/2003 | Fernandez .......... G03F 7/70375 355/53 |
| 2006/0169928 A1 | 8/2006 | Sogard et al. |
| 2007/0228286 A1 | 10/2007 | Lewellen et al. |
| 2008/0291952 A1 | 11/2008 | Yamamoto et al. |
| 2011/0089397 A1 | 4/2011 | Ujihara et al. |
| 2013/0009058 A1 | 1/2013 | Tanaka et al. |
| 2013/0193342 A1 | 8/2013 | Berney |
| 2017/0077352 A1 | 3/2017 | Kondo et al. |
| 2020/0241309 A1* | 7/2020 | Yamada .............. G02B 27/0955 |
| 2020/0303152 A1 | 9/2020 | Ohshima et al. |

FOREIGN PATENT DOCUMENTS

| | | |
|---|---|---|
| JP | 2001143648 A | 5/2001 |
| JP | 2001176120 A | 6/2001 |
| JP | 2001526446 A | 12/2001 |
| JP | 2002124205 A | 4/2002 |
| JP | 2003525514 A | 8/2003 |
| JP | 2009266809 A | 11/2009 |
| JP | 2010218868 A | 9/2010 |
| JP | 2017054954 A | 3/2017 |
| WO | 9930348 A1 | 6/1999 |
| WO | 2017168554 A1 | 10/2017 |

OTHER PUBLICATIONS

Izumitani, Tetsuro. "High Precision Moulding of Aspherical Glass Lenses. Journal of the Japan Society of Precision Engineering" pp. 12-15.

Search Report dated Apr. 10, 2019 in International Application No. PCT/JP2019/002803.

Written Opinion dated Apr. 10, 2019 in International Application No. PCT/JP2019/002803.

Office Action dated Sep. 2, 2019 in Chinese Application No. 201680084076.4.

Search Report dated Jun. 14, 2016 in International Application No. PCT/JP2016/060089.

* cited by examiner

[FIG. 1]
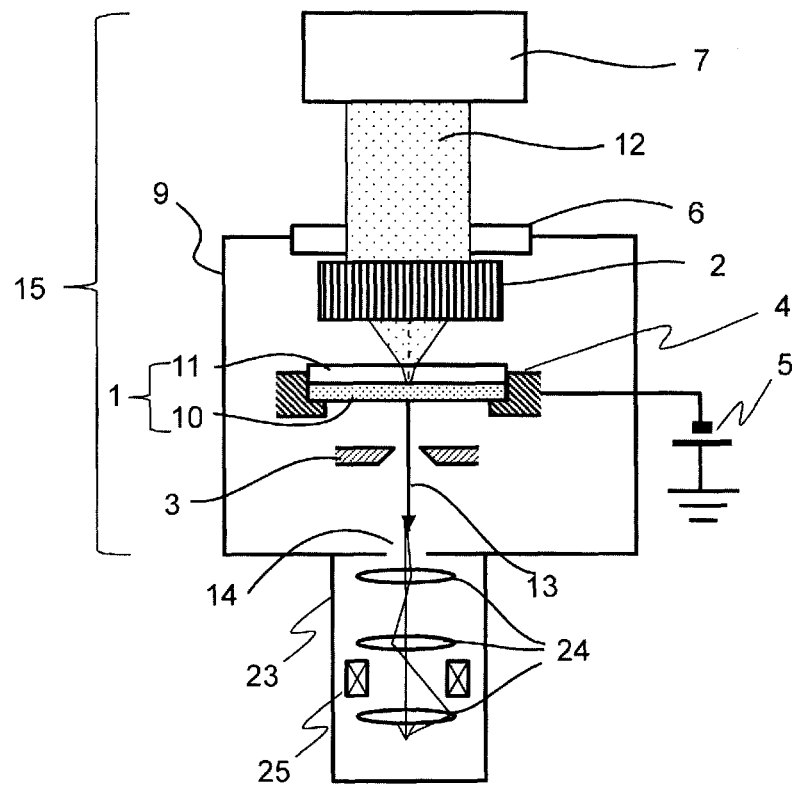
[FIG. 2A]
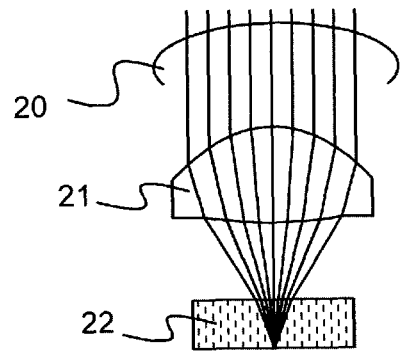

[FIG. 2B]
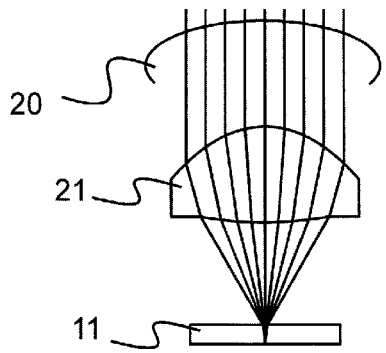
[FIG. 2C]
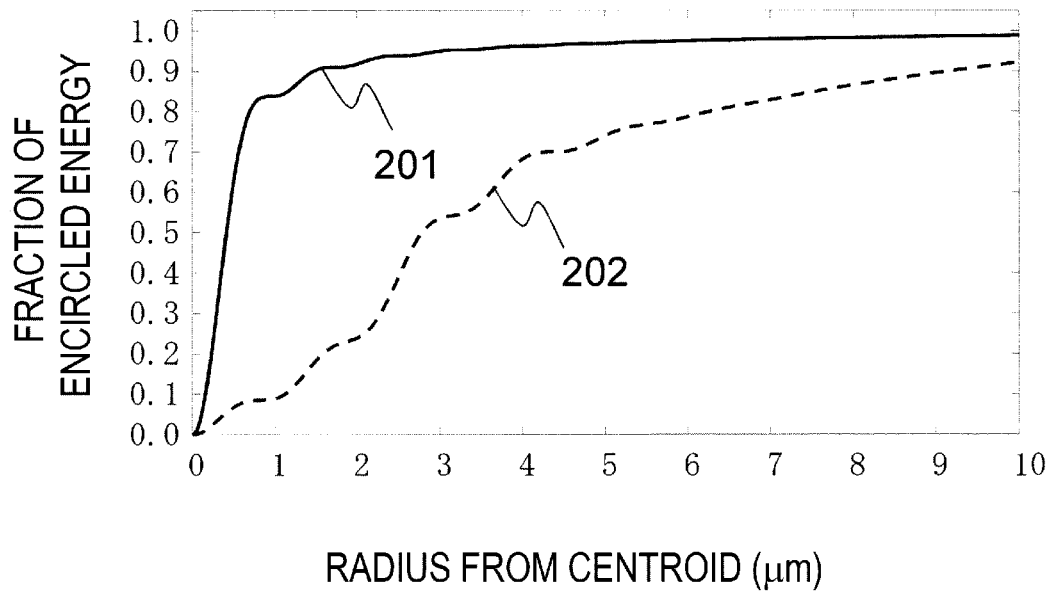
RADIUS FROM CENTROID (μm)
[FIG. 2D]
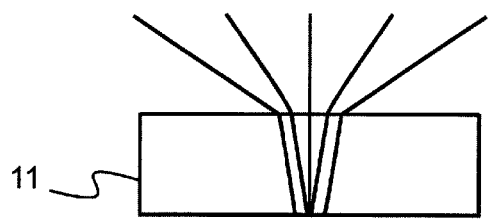

[FIG. 3]
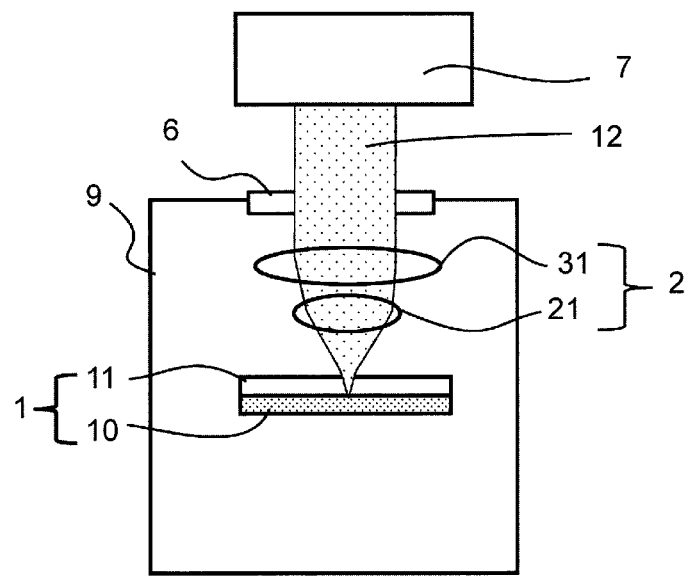
[FIG. 4A]
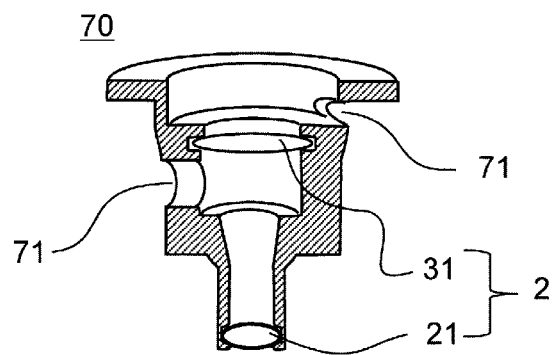

[FIG. 4B]
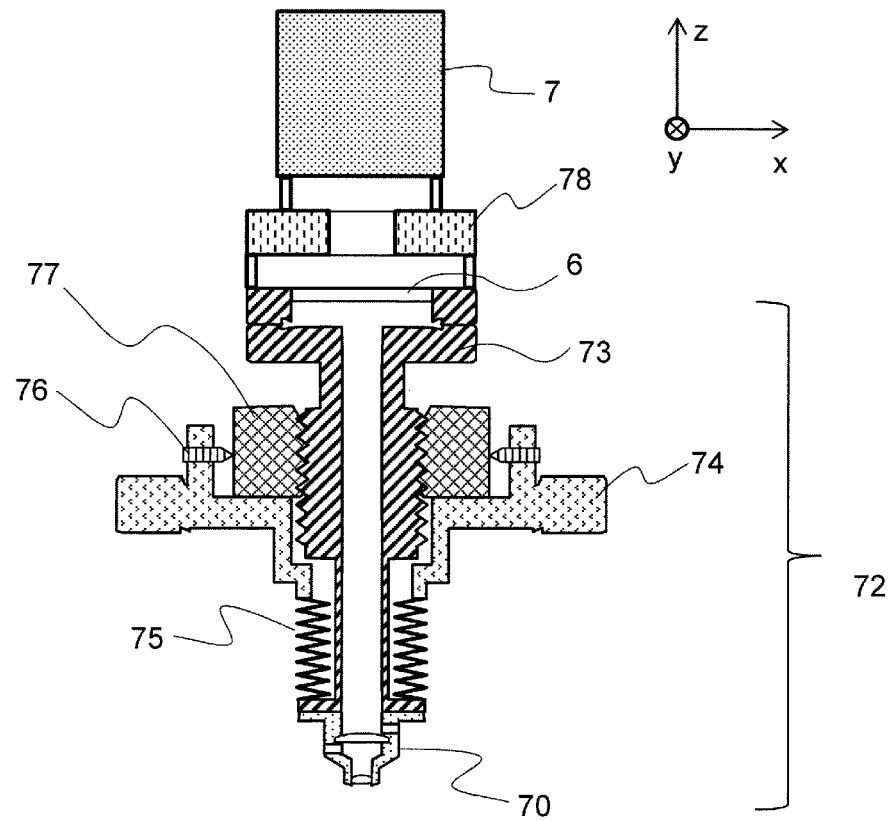
[FIG. 5]
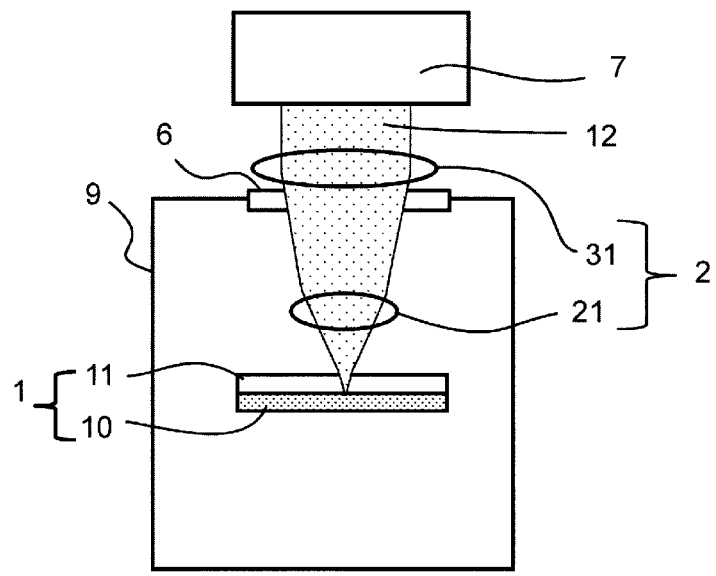

[FIG. 6]
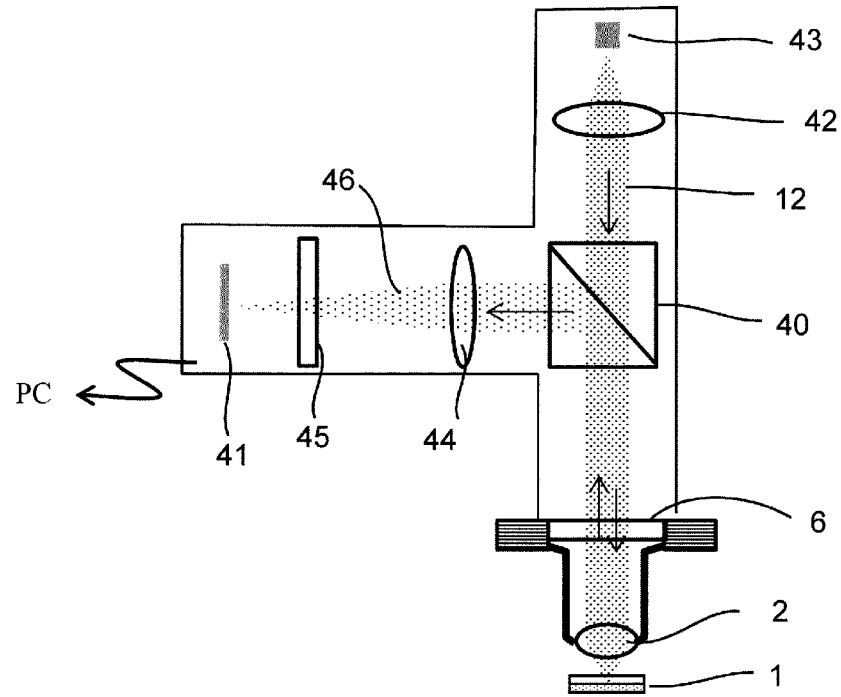
[FIG. 7A]
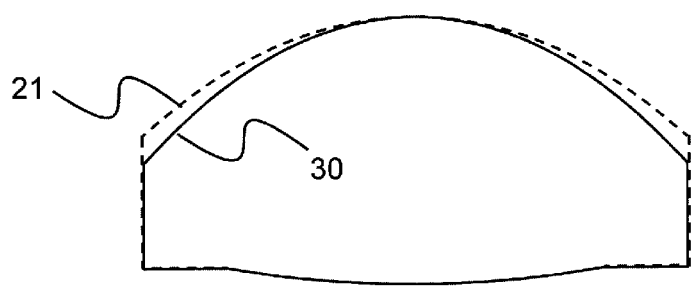

[FIG. 7B]
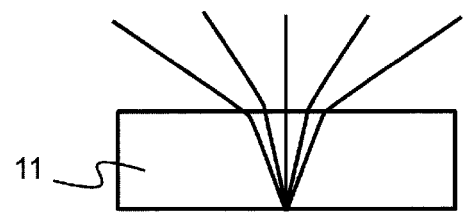

ELECTRON BEAM APPARATUS

TECHNICAL FIELD

The present invention relates to an electron beam apparatus such as an electron microscope.

BACKGROUND ART

In a high-resolution electron microscope, a cold field emission electron source or a Schottky electron source is used as a high-brightness electron source in the related art. These electron sources have a needle shape with a small distal end, and a virtual source size is several nm to several tens of nm. In contrast, a photoexcited electron source using a negative electron affinity is a planar electron source, and a focus size of an excitation light as a source size is as large as about 1 μm. Since straightness of electrons emitted from the photoexcited electron source is good, high brightness is expected by increasing a current density.

PTL 1 discloses a photoexcited electron source. An electron gun structure is disclosed in which a transparent substrate, specifically, a substrate obtained by attaching a photocathode film (photoemissive film) on a glass is used as a photocathode, an excitation light is converged on the photoemissive film by a focusing lens placed close to the transparent substrate to form a small electron source, and an electron beam emitted from the electron source into vacuum is used. As a photocathode suitable for high brightness, in recent years, as disclosed in PTL 2, a semiconductor photocathode is developed in which a photocathode layer is formed on a semiconductor substrate using a semiconductor crystal growth technique. As shown in Non-PTL 1, a semiconductor photocathode has characteristics similar to those of the Schottky electron source.

CITATION LIST

Patent Literature

PTL 1: JP-A-2001-143648
PTL 2: JP-A-2009-266809

Non Patent Literature

Non-PTL 1: Kuwahara and others, "Coherence of a spin-polarized electron beam emitted from a semiconductor photocathode in a transmission electron microscope" Applied Physics Letters, Vol. 105, p. 193101, 2014

SUMMARY OF INVENTION

Technical Problem

Non-PTL 1 discloses a transmission electron microscope (TEM) using the semiconductor photocathode as the electron source. In an electron optics of the TEM, an entire observation region of a sample is irradiated with an electron beam in the same manner as in an optical microscope. A resolution of the TEM is determined by a parallelism of the electron beam with which the sample is irradiated.

In contrast, in an electron optics of a scanning electron microscope (SEM), an electron beam is narrowed to a small spot and emitted to the sample, and the sample is two-dimensionally scanned by the spot of the electron beam to form an image. A resolution of the SEM is basically determined by how much the electron beam with which the sample is irradiated can be narrowed. For example, Non-PTL 1 discloses a spot shape of the electron beam on the sample in the TEM using the semiconductor photocathode as the electron source, but in this example, a spot diameter is about 1 μm. In contrast, in the electron optics of the SEM, it is necessary to narrow the spot diameter of the electron beam on the sample to an order of nm or less.

When the photoexcited electron source is used, it is necessary to focus the excitation light on the photoemissive film of the photocathode by a focusing lens. At this time, the excitation light passes through the transparent substrate of the photocathode and focuses on the photoemissive film. In the photocathode in which the photoemissive film is attached to the glass substrate as in PTL 1, an electron gun can be implemented at a low cost by forming the photocathode using the focusing lens optimally designed on an assumption that the light passes through the glass substrate having a predetermined thickness and a predetermined refractive index and using the glass substrate corresponding to the focusing lens. On the other hand, in recent years, a photocathode having a higher brightness is implemented by using the crystal growth technique in a semiconductor photocathode. However, in the optics of the photoexcited electron source as shown in PTL 1, even if the photocathode in the related art is replaced with the semiconductor photocathode as it is, the electron beam emitted from the photoexcited electron source cannot be narrowed down to the spot diameter required for the resolution of the SEM.

Solution to Problem

An electron beam apparatus which is an embodiment of the invention includes a photocathode including a substrate having a refractive index of more than 1.7 and a photoemissive film, a focusing lens configured to focus an excitation light toward the photocathode, an extractor electrode disposed facing the photocathode and configured to accelerate an electron beam generated from the photoemissive film of the photocathode by focusing the excitation light by the focusing lens and emitting the excitation light through the substrate of the photocathode, and an electron optics including a deflector configured to two-dimensionally scan a sample by the electron beam accelerated by the extractor electrode. For a spherical aberration of the focusing lens, a root mean square of the spherical aberration on the photoemissive film is equal to or less than $1/14$ of a wavelength of the excitation light.

Advantageous Effect

In the scanning electron beam apparatus which two-dimensionally scans the sample by the electron beam, high resolution is achieved even when a photoexcited electron source is used as an electron source.

Other problems and novel features are obvious from the present specification and the accompanying drawings.

BRIEF DESCRIPTION OF DRAWINGS

FIG. 1 is a schematic diagram of an electron beam apparatus including a photoexcited electron gun.

FIG. 2A is a diagram showing a state in which an excitation light is focused by an optical disc aspheric lens.

FIG. 2B is a diagram showing a state in which the excitation light is focused by the optical disc aspheric lens.

FIG. 2C is a diagram showing an encircled energy distribution on a photoemissive surface of a photocathode.

FIG. 2D is a diagram showing a state in which the excitation light focused by the optical disc aspheric lens is emitted on a GaP substrate.

FIG. 3 is a configuration diagram of a photoexcited electron gun according to a first embodiment.

FIG. 4A is a configuration diagram of a lens holder.

FIG. 4B is a configuration diagram of a lens stage.

FIG. 5 is a configuration diagram of the photoexcited electron gun according to the first embodiment.

FIG. 6 is a schematic diagram of a control mechanism of the lens stage.

FIG. 7A is a diagram showing a focusing lens (aspheric lens) according to a second embodiment.

FIG. 7B is a diagram showing a state in which an excitation light focused by the aspheric lens according to the second embodiment is emitted on the GaP substrate.

DESCRIPTION OF EMBODIMENTS

Hereinafter, embodiments of the invention will be described with reference to the drawings.

FIG. 1 is a schematic diagram of an electron beam apparatus including a photoexcited electron gun. When the electron beam apparatus is an electron microscope, a high brightness electron beam 13 generated from a photoexcited electron gun 15 is guided to a connected electron optics housing 23 so that the electron beam apparatus acts as a microscope with components such as electron lenses 24 and a deflector 25. In particular, the photoexcited electron gun of the present embodiment is suitable as an electron source of an SEM or a scanning transmission electron microscope (STEM) in which an electron beam is narrowed and the sample is two-dimensionally scanned by the deflector 25.

In the electron gun 15, an excitation light 12 generated from a parallel source 7 placed outside a vacuum container 9 is introduced into the vacuum container 9 through a window 6, and the light is focused on a photocathode 1 with a focusing lens 2. The photocathode 1 is mainly formed by a transparent substrate 11 and a photoemissive film 10. The excitation light is emitted from a transparent substrate 11 side, and the electron beam is generated from a surface of the photoemissive film 10. The electron beam 13 is accelerated by an electric field between the photocathode 1 and an extractor electrode 3 facing the photocathode 1, passes through an opening 14, and is emitted into the electron optics housing 23. The photocathode 1 is housed in a cathode holder 4 and is electrically connected to an acceleration power source 5 to define acceleration energy of the generated electron beam. The photocathode 1 uses a phenomenon known as an electron source using negative electron affinity. The photoemissive film 10 is a p-type semiconductor and GaAs is typically used. Cs adsorption is performed on the surface of the photoemissive film 10 for lowering a work function. The transparent substrate 11 is made of GaP (100) single crystal having a thickness of 0.4 to 0.5 mm in order to epitaxially grow a crystal of the photoemissive film 10.

Here, the focusing lens 2 is provided to focus the excitation light 12 from the parallel source 7 in a narrow range on the photoemissive film 10. An influence of the transparent substrate of the photocathode on a focusing action of the excitation light by the focusing lens will be described with reference to FIGS. 2A to 2D. FIG. 2A shows a state in which a parallel light 20 (wavelength 780 nm) is emitted to a glass substrate 22 through an optical disc aspheric lens 21. The glass substrate 22 is a glass substrate having a thickness of 1.2 mm and a refractive index of 1.5, and the aspheric lens 21 is optimized with respect to the glass substrate 22. At this time, a solid line 201 in FIG. 2C shows an encircled energy distribution with a center of an optical path on the photoemissive surface as an axis when the parallel light 20 is focused by the aspheric lens 21. In this case, a spherical aberration depending on the lens is minimized, and only a diffraction aberration depending on the wavelength of the light is a diffraction limit for determining a focal point shape.

In contrast, FIG. 2B shows a state in which the parallel light 20 (wavelength 780 nm) is emitted to the transparent substrate 11 through the same aspheric lens 21. The transparent substrate 11 is a substrate of the semiconductor photocathode, and is a GaP substrate having a thickness of 0.4 mm. A refractive index of the GaP substrate is 3.2. A broken line 202 in FIG. 2C shows an encircled energy distribution with the center of the optical path on the photoemissive surface as an axis when the parallel light 20 is focused by the aspheric lens 21. It can be seen that the encircled energy distribution of the broken line 202 is widely dispersed from the center of the optical path as compared to a case where the encircled energy distribution of the solid line 201 is concentrated in a narrow range of the center of the optical path. FIG. 2D shows a light emitted on the GaP substrate 11. In this way, since a position in an optical axis direction at which the optical path passing through the central portion of the lens 21 converges is shifted from a position in the optical axis direction at which the optical path passing through a peripheral portion of the lens 21 converges, the parallel light 20 cannot be sufficiently focused on the photoemissive surface. That is, a large spherical aberration occurs. When electrons are emitted from a wide region of the photoemissive film, a brightness of the electron source decreases and a diameter of the electron source increases. A size of the electron source restricts the electron beam which can be narrowed down, and as a result, a spot diameter of the electron beam 13 on the sample increases, and a resolution of the SEM decreases. This is because conditions of the refractive index and the thickness of the semiconductor photocathode are not design conditions of the aspheric lens 21.

First Embodiment

As a first embodiment, FIG. 3 shows an example of a photoexcited electron gun in which the focusing lens 2 includes a compound lens. The aspheric lens 21 has a focal point length f of 4.2 mm, a numerical aperture (NA) of 0.5, and is designed to be able to focus the light to a minimum diameter when the light passes through a glass substrate having a thickness of 1.2 mm and a refractive index of 1.5. As such an aspheric lens, there is an aspheric lens formed by a glass molding method commercially available for an optical disc. In the first embodiment, the focusing lens 2 is the compound lens in which the aspheric lens 21 is combined with a correction lens 31 for minimizing the spherical aberration on the photoemissive surface, thereby obtaining an optimal focal point as shown by the solid line 201 in FIG. 2C on the photoemissive surface. The correction lens 31 is a convex lens, and can correct the spherical aberration on the focal point by converting the light emitted on the aspheric lens 21 from the parallel light to a converged light. In the spherical aberration caused by the compound lens, a root mean square (RMS) of the spherical aberration on the photoemissive film is equal to or less than $\lambda/14$. Here, $\lambda$ is a wavelength of the excitation light, and corresponds to satisfying a Marecal criterion.

For example, when a thickness of the transparent substrate 11 (GaP substrate) is 0.4 mm and the excitation light wavelength is 780 nm, the correction lens 31 having a focal point length f=60 mm is used with a distance from the aspheric lens 21 fixed at a distance of 20 mm to 35 mm. Since an accuracy of a mutual positional relationship of the compound lens greatly affects a degree of correction of the spherical aberration, it is preferable to hold the compound lens by a lens holder 70 as shown in FIG. 4A. The lens holder 70 coaxially fixes the aspheric lens 21 and the correction lens 31. In this case, since upper and lower sides of the correction lens 31 are placed in the vacuum container 9 of the electron gun, exhaust holes 71 are provided in the upper and lower sides of the correction lens 31. The lens holder 70 is fixed to a distal end of a lens stage 72 shown in FIG. 4B. A position of a movable portion 73, including the window 6 separating the vacuum and the atmosphere, of the lens stage 72 can be integrally adjusted with respect to the photocathode 1 from the parallel source 7 to the focusing lens 2 held by the lens holder 70. In a configuration of FIG. 4B, a vacuum flange 74 is fixed to the vacuum container 9. In the movable portion 73, the window 6 is disposed at one end portion thereof, and the lens holder 70 is disposed at the other end portion thereof, and the movable portion 73 is connected to the vacuum flange 74 by a bellows 75. Further, a cavity through which the excitation light passes is provided between the window 6 and the lens holder 70, and a space in the cavity is maintained in vacuum. Here, a longitudinal direction of the cavity of the movable portion 73 is set as a z axis, and the window 6 is defined as being disposed on a plane defined by an x axis and a y axis which are perpendicular to the z axis. A position of the movable portion 73 on the x-y plane is adjusted by a lens stage x-y adjusting screw 76 provided on the vacuum flange 74, and a position of the movable portion 73 on the z axis (optical axis) is adjusted by a lens stage z-adjusting screw 77 provided on the vacuum flange 74.

Further, since the focusing lens 2 includes the two lenses, axis alignment with the parallel excitation light is required, and therefore, the parallel source 7 is mounted with respect to the lens stage 72 by a four-axis optical path adjustment mechanism 78 of x-y position adjustment and x-y inclination adjustment. That is, the optical path adjustment mechanism 78 has two axes for adjusting a position on a zy plane and two axes for adjusting the inclination in the x axis direction and the inclination in the y axis direction with respect to the xy plane.

In an example of FIG. 3, as the focusing lens 2, the aspheric lens 21 and the correction lens 31 are placed in vacuum, but as long as the excitation light is emitted on the aspheric lens 21 in a desired trajectory, the same effect can be obtained even when the correction lens 31 is in the atmosphere as shown in FIG. 5. In this case, the correction lens 31 having a longer focal point length than the correction lens in the configuration of FIG. 3 may be selected. In a case of a configuration of FIG. 5, there is an effect that optimization of the optics becomes easier by introducing a mechanism for adjusting a position and an angle of the correction lens 31 placed in the atmosphere. In particular, since the vacuum container 9 constituting the electron gun needs to be maintained at high vacuum, it is an effective configuration that the correction lens 31 can be replaced and the trajectory of the excitation light can be adjusted by the correction lens 31 in the atmosphere.

FIG. 6 shows a control mechanism of the lens stage 72. A source 43 of the excitation light is a laser diode or an optical fiber end. A divergent light from the source 43 is converted into the parallel excitation light 12 by a collimator lens 42. The parallel source 7 in FIGS. 1 and 4B has a configuration corresponding to the source 43 and the collimator lens 42. The excitation light 12 passes through a beam splitter 40, enters the vacuum container of the electron gun through the window 6, and is focused on the photocathode 1 by the focusing lens 2. A reflected light 46 reflected from the photoemissive surface becomes the parallel light with the focusing lens 2, is laterally bent by the beam splitter 40, and enlarged and projected on an imaging element 41 with an imaging lens 44. When an intensity of the reflected light 46 is too high for the imaging element 41, the intensity is appropriately attenuated by a neutral density (ND) filter 45 to measure a spatial distribution of the light intensity. Here, when a focal point length f of the focusing lens 2 is 4.2 mm and a lens having a focal point length f=100 mm is used as the imaging lens 44, a 23.8-fold image on the photoemissive film is projected on the imaging element 41. Accordingly, by monitoring this output with a PC and the like, the image of the focal point of the excitation light focused on the photoemissive surface of the photocathode 1 can be observed. In the focus adjustment, a shape of the enlarged focal point obtained by the imaging element 41 is monitored by the PC and the like, and the position of the lens stage 72 in the z axis direction is adjusted so that a spot is minimized, thereby optimizing the focal point of the excitation light on the photocathode 1.

When the excitation light 12 from the source 43 is polarized, it is possible to increase transmittance using the beam splitter 40 as a polarizing beam splitter, which is effective. Further, a plane of polarization of the reflected light 46 is rotated so as not to return to the source 43 by providing a ¼ wave plate directly below the beam splitter, so that a light returned to the laser diode can be minimized, which is advantageous in that an operation can be stabilized.

Although an example in which the optical disc aspheric lens is used as the aspheric lens 21 has been described, the invention is not limited thereto, and the same effect can be obtained by appropriately using the correction lens 31 even when another lens is used. For example, for a collimator lens of the laser diode, an aspheric lens which minimizes the spherical aberration through a glass substrate having a thickness of 0.25 mm and an aspheric lens which minimizes the spherical aberration in the atmosphere or in vacuum (without transmitting the glass or the like) are commercially available. Even for such an aspheric lens, by adding the correction lens corresponding to the transparent substrate 11, it is possible to configure the high-performance electron gun using the semiconductor photocathode.

Further, although the correction lens is the single convex lens, it is obvious that the correction lens may be combined with another concave lens or convex lens. In general, a refractive index of the transparent single crystal substrate has wavelength dependency. For example, in a case of the GaP substrate, the refractive index is 3.2 when the wavelength of the excitation light is 780 nm, and the refractive index is 3.3 when the wavelength of the excitation light is 680 nm. Therefore, when the correction lens includes a plurality of lenses, it is easy to optimize the focal point shape in accordance with the wavelength to be used.

Further, although an example in which the GaP substrate is used as the transparent substrate 11 has been described, the invention can also be applied to a semiconductor photocathode formed on a single crystal substrate such as AlAs, GaAlAs, ZnSe, GaN, and GaInN as another semiconductor substrate. Refractive indexes of these substrates are 2.3 to 3.3. Further, a transparent oxide may be used as a crystal growth substrate. For example, a sapphire substrate can be used as the crystal growth substrate of GaN-based and GaAs. A refractive index of the sapphire substrate is 1.75 to 1.8.

Second Embodiment

In the first embodiment, the condenser lens 2 is configured as a compound lens, and it is also possible to configure the focusing lens 2 as a single aspheric lens instead of the compound lens. FIG. 7A shows an example of an aspheric lens 30 designed such that an excitation light can be focused to a minimum diameter on a photoemissive surface when passing through the transparent substrate 11 (GaP substrate) having a thickness of 0.4 mm (FIG. 7B). In FIG. 7A, a cross-sectional shape of the aspheric lens 30 is shown in comparison with that of the aspheric lens 21. Specifically, in order to make a focal point shape of the excitation light focused by the aspheric lens 30 a size determined by a diffraction limit, a spherical aberration of the aspheric lens 30 is set such that an RMS of the spherical aberration on the photoemissive film is equal to or less than $\lambda/14$. Here, $\lambda$ is a wavelength of the excitation light, and corresponds to satisfying a Marecal criterion.

A shape of the aspheric lens 30 increases a convergence effect as a distance from a center increases as compared to the optical disc aspheric lens 21. That is, by increasing a curvature as the distance from the center increases, the spherical aberration is minimized, and as shown in FIG. 7B, the excitation light can be focused to the minimum diameter on the photoemissive surface. As a result, an encircled energy distribution by the aspheric lens 30 is the solid line 201 in FIG. 2C, and a focal point of the diffraction limit is obtained.

In a case of the first embodiment, since the focusing lens 2 is configured as the compound lens, it is necessary to adjust a positional relationship between the aspheric lens and the correction lens configuring the compound lens with high accuracy. In contrast, in a case of the second embodiment, since the focusing lens can be formed of the single compound lens, an optical axis of the excitation light can be easily adjusted. As a result, in the lens stage shown in FIG. 4B, the optical path adjustment mechanism 78 can be eliminated.

Since the refractive index of the transparent single crystal substrate has the wavelength dependency as described above, it is desirable that the aspheric lens 30 is optimized for the refractive index and the thickness at the wavelength to be used.

Although the invention made by the present inventors has been specifically described based on the embodiments, the invention is not limited to the embodiments, and various modifications can be made without departing from the gist of the invention. For example, when the photocathode 1 is an electron source using negative electron affinity, an electron emission surface is surface-sensitive. Therefore, when an activation chamber is provided adjacent to the electron gun 15, and a mechanism such as surface cleaning, Cs vapor deposition, and oxygen introduction is provided such that a surface of the photoemissive film 10 which is surface-activated or deteriorated can be re-activated, there is an advantage that the photocathode can be used for a long period of time. At this time, it is desirable to provide a transfer mechanism for moving the photocathode 1 between the electron gun 15 and the activation chamber.

REFERENCE SIGN LIST 1 photocathode
2 focusing lens
3 extractor electrode
4 cathode holder
5 acceleration power source
6 window
7 parallel source
9 vacuum container
10 photoemissive film
11 transparent substrate
12 excitation light
13 electron beam
14 opening
15 photoexcited electron gun
20 parallel light
21 optical disc aspheric lens
22 glass substrate
23 electron optics housing
24 electron lens
25 deflector
30 Gap substrate aspheric lens
31 correction lens
40 beam splitter
41 imaging element
42 collimator lens
43 source
44 imaging lens
45 ND filter
46 reflected light
70 lens holder
71 exhaust hole
72 lens stage
73 movable portion
74 vacuum flange
75 bellows
76 lens stage x-y adjusting screw
77 lens stage z-adjusting screw
78 optical path adjustment mechanism

The invention claimed is:

1. An electron beam apparatus comprising:
a photocathode including a substrate having a refractive index of more than 1.7 and a photoemissive film;
a focusing lens configured to focus an excitation light toward the photocathode;
an extractor electrode disposed facing the photocathode and configured to accelerate an electron beam generated from the photoemissive film of the photocathode by focusing the excitation light by the focusing lens and emitting the excitation light through the substrate of the photocathode; and
an electron optics including a deflector configured to two-dimensionally scan a sample by the electron beam accelerated by the extractor electrode, wherein
for a spherical aberration of the focusing lens, a root mean square of the spherical aberration on the photoemissive film is equal to or less than $1/14$ of a wavelength of the excitation light.

2. The electron beam apparatus according to claim 1, wherein
the photoemissive film of the photocathode is formed by epitaxially growing a crystal on a single crystal substrate transparent to the excitation light.

3. The electron beam apparatus according to claim 1, wherein
the focusing lens includes an aspheric lens.

4. The electron beam apparatus according to claim 1, wherein
the focusing lens is a compound lens including an aspheric lens and at least one convex lens.

5. The electron beam apparatus according to claim 4, further comprising:
- a vacuum container in which the extractor electrode and the photocathode are disposed; and
- a lens stage configured to hold the compound lens, wherein the lens stage includes:
- a vacuum flange fixed to the vacuum container; and
- a movable portion which is movably attached to the vacuum flange, includes a window for allowing the excitation light to enter at one end portion, includes a lens holder for holding the compound lens at another end portion, and is provided with a cavity for allowing the excitation light to pass between the window and the lens holder.

6. The electron beam apparatus according to claim 5, wherein
the convex lens of the compound lens is held by the lens holder on a side closer to the window than the aspheric lens, and the lens holder has an exhaust hole through which the vacuum container and a space in the lens holder are communicated with each other above and below the convex lens.

7. The electron beam apparatus according to claim 5, further comprising:
- a source configured to emit the excitation light as a parallel light, wherein the source is mounted on the lens stage via an optical path adjustment mechanism, and when a longitudinal direction of the cavity of the movable portion is set as a z axis and the window is on a plane defined by an x axis and a y axis which are perpendicular to the z axis, the optical path adjustment mechanism has two axes for adjusting a position on the xy plane and two axes for adjusting an inclination in an x axis direction and an inclination in a y axis direction with respect to the xy plane.

8. The electron beam apparatus according to claim 4, further comprising:
- a vacuum container in which the extractor electrode and the photocathode are disposed, wherein the aspheric lens is disposed in vacuum in the vacuum container, and the convex lens is disposed in an atmosphere.

\* \* \* \* \*